US009230830B2

(12) United States Patent
Brunschwiler et al.

(10) Patent No.: US 9,230,830 B2
(45) Date of Patent: Jan. 5, 2016

(54) BRIDGING ARRANGEMENT AND METHOD FOR MANUFACTURING A BRIDGING ARRANGEMENT

(71) Applicant: International Business Machines Corporation, Armonk, NY (US)

(72) Inventors: Thomas J. Brunschwiler, Rueschlikon (CH); Javier V. Goicochea, Rueschlikon (CH); Cyrill Kuemin, Freienbach (CH); Walter H. Riess, Rueschlikon (CH); Heiko Wolf, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/616,983

(22) Filed: Feb. 9, 2015

(65) Prior Publication Data
US 2015/0155186 A1 Jun. 4, 2015

Related U.S. Application Data

(62) Division of application No. 13/438,254, filed on Apr. 3, 2012, now Pat. No. 8,951,445.

(30) Foreign Application Priority Data

Apr. 14, 2011 (EP) .................................... 11162455

(51) Int. Cl.
*H01L 23/488* (2006.01)
*H01L 21/60* (2006.01)
(Continued)

(52) U.S. Cl.
CPC .............. *H01L 21/56* (2013.01); *H01L 21/563* (2013.01); *H01L 23/295* (2013.01); *H01L 24/29* (2013.01); *H01L 24/32* (2013.01); *H01L 24/75* (2013.01);
(Continued)

(58) Field of Classification Search
CPC ......... H01L 23/488; H01L 21/60; H01B 1/22
USPC ............ 257/741, E23.023, E21.509, E21.476
See application file for complete search history.

(56) References Cited

U.S. PATENT DOCUMENTS 5,206,585 A * 4/1993 Chang et al. ............. 324/756.05
5,891,366 A * 4/1999 Gruenwald et al. .......... 252/514
(Continued)

FOREIGN PATENT DOCUMENTS

JP          2005340279 A      12/2005

OTHER PUBLICATIONS

Rabindra N. Das, et al., "Nanofluids, Nanogels, and Nanopastes for Electronic Packaging," Electronic Components and Technology Conference; IEEE; pp. 1231-1238; 2010.
(Continued)

*Primary Examiner* — David Vu
*Assistant Examiner* — Mouloucoulaye Inoussa
(74) *Attorney, Agent, or Firm* — Cantor Colburn LLP

(57) ABSTRACT

A bridging arrangement for coupling a first terminal to a second terminal includes a plurality of particles of a first type forming at least one path between the first terminal and the second terminal, wherein the particles of the first type are attached to each other; a plurality of particles of a second type arranged in a vicinity of a contact region between a first particle of the first type and a second particle of the first type, wherein at least a portion of the plurality of particles of the second type is attached to the first particle of the first type and the second particle of the first type.

13 Claims, 14 Drawing Sheets

(51) Int. Cl.
  *H01L 21/56* (2006.01)
  *H01L 23/29* (2006.01)
  *H01L 23/00* (2006.01)
  *H01L 25/065* (2006.01)

(52) U.S. Cl.
  CPC ............ *H01L 24/83* (2013.01); *H01L 25/0657* (2013.01); *H01L 2224/131* (2013.01); *H01L 2224/13147* (2013.01); *H01L 2224/16145* (2013.01); *H01L 2224/16225* (2013.01); *H01L 2224/16227* (2013.01); *H01L 2224/2936* (2013.01); *H01L 2224/29294* (2013.01); *H01L 2224/29324* (2013.01); *H01L 2224/29339* (2013.01); *H01L 2224/29344* (2013.01); *H01L 2224/29347* (2013.01); *H01L 2224/29355* (2013.01); *H01L 2224/29388* (2013.01); *H01L 2224/29393* (2013.01); *H01L 2224/29499* (2013.01); *H01L 2224/3201* (2013.01); *H01L 2224/32145* (2013.01); *H01L 2224/32225* (2013.01); *H01L 2224/73204* (2013.01); *H01L 2224/81191* (2013.01); *H01L 2224/83102* (2013.01); *H01L 2224/83886* (2013.01); *H01L 2225/06513* (2013.01); *H01L 2225/06517* (2013.01); *H01L 2225/06589* (2013.01); *H01L 2924/01012* (2013.01); *H01L 2924/01019* (2013.01); *H01L 2924/01029* (2013.01); *H01L 2924/10253* (2013.01)

(56) References Cited

U.S. PATENT DOCUMENTS

| | | | |
|---|---|---|---|
| 7,658,988 | B2 | 2/2010 | Lin et al. |
| 7,816,780 | B2 | 10/2010 | Kajiwara et al. |
| 2007/0190240 | A1 | 8/2007 | Choi et al. |
| 2008/0145607 | A1 | 6/2008 | Kajiwara et al. |
| 2009/0115071 | A1* | 5/2009 | Karashima et al. ........... 257/778 |
| 2010/0320506 | A1 | 12/2010 | Varangis et al. |
| 2011/0018136 | A1 | 1/2011 | Bedair et al. |

OTHER PUBLICATIONS

Tetsuo Takayama, et al., "Effect of Nano- and Micro-Particles on Fracture Characteristic of HA/PLLA Composites," 16th International Conference on Composite Materials, pp. 1-5; 2007.

* cited by examiner

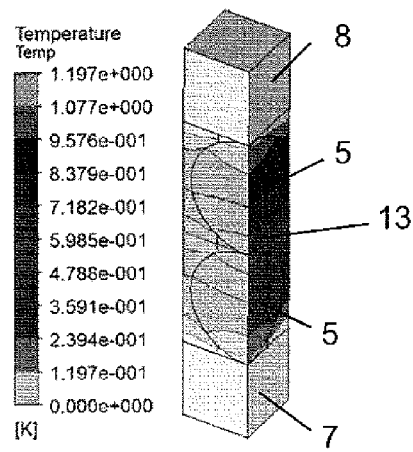 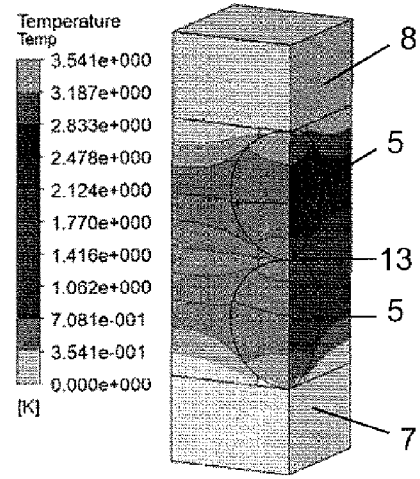
Fig. 19  Fig. 20
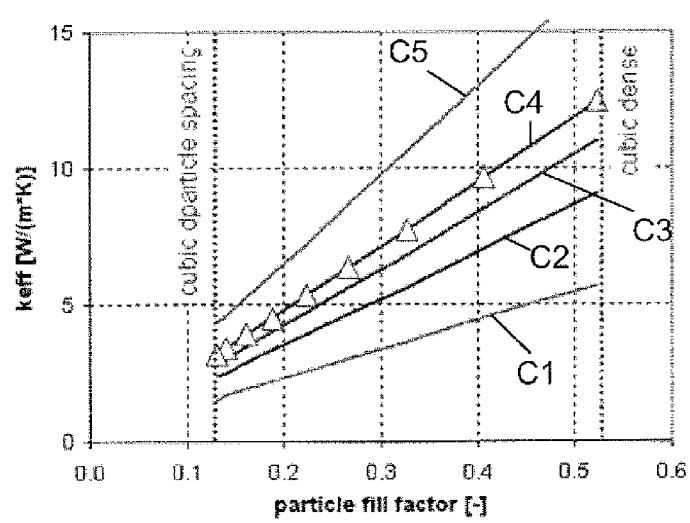
Fig. 21

BRIDGING ARRANGEMENT AND METHOD FOR MANUFACTURING A BRIDGING ARRANGEMENT

DOMESTIC AND FOREIGN PRIORITY

This application is a divisional of U.S. patent application Ser. No. 13/438,254, filed Apr. 3, 2012, now U.S. Pat. No. 8,951,445, which claims priority to European Patent Application No. 11162455.7, filed 14 Apr. 2011, and all the benefits accruing therefrom under 35 U.S.C. §119, the contents of which in its entirety are herein incorporated by reference.

BACKGROUND

This disclosure relates to arrangements for coupling at least two surfaces, e.g., in terms of a thermal, electric or mechanical connection between the surfaces. Further methods for manufacturing a bridging arrangement or device for coupling two surfaces are presented. The disclosure also relates to devices and methods for filling a gap region between two surfaces, as for example an underfill for flip-chip packages.

In many applications, gap regions that are confined by at least two surfaces are filled with particles and cured resins, to provide for a bridging between the surfaces. Often the obtained fillings should have desired physical properties. For example, certain applications may require electrically conducting underfills. Other applications may rely on mechanical rigidity or a specific thermal dissipation through the filling.

In modern electronic devices, for example, substantial gains in performance are achieved by means of circuit miniaturization and by the integration of single-package multifunctional chips. The scalability and performance of such electronic devices are related to their ability to dissipate heat. In typical flip chip arrangements, one integrated circuit (IC) surface is used for heat removal through a heat sink, while the other for power delivery and data communication. Power is delivered throughout solder balls attached to electrical pads on the IC chip that are reflowed and coupled to the main circuit board.

To minimize mechanical stress in the on-chip wiring layers and the solder balls and to protect them electrically, mechanically, and chemically the gap region between, e.g., IC chip and board (created due to the presence of solder balls) is conventionally filled with electrically non-conductive materials, known as underfills. Current efforts towards 3D chip integration, with solder balls as electrical connection between silicon dies, demand high thermally conductive underfills to efficiently dissipate the heat of lower dies to the heat removal embodiment.

Conventional underfills consist of a curable matrix (e.g., epoxy resin) loaded with silica filler particles, which have a similar thermal expansion coefficient (CTE) to that of the silicon. Currently, the requirement of matching CTE dictates the type, and volumetric fill of fillers to be employed in a given underfill. For thermal underfills bridging the surface of an IC chip and a substrate or circuit board the thermal conductivity of filler materials which are used to increase the thermal contact and enhance heat dissipation between connected surfaces should be high. Therefore, $Al_2O_3$, AlN, BN or other metal and nonmetal materials are used, for example.

The application of underfills in gap regions is limited by the filler volume fraction, since the resulting viscosity depends on the filler content. According to some conventional methods the underfill material is applied to the chip periphery and capillary forces transports the viscous media into the gap, within a certain time period, prior to a temperature assisted curing. Generally, a high particle load, e.g., >30 vol % is needed to reach thermal conductivity values>0.5 W/m/K. Then the viscosity of the applied medium may become too high to efficiently fill the gaps.

SUMMARY

In one embodiment, a bridging arrangement for coupling a first terminal to a second terminal includes a plurality of particles of a first type forming at least one path between the first terminal and the second terminal; and a plurality of particles of a second type arranged in a vicinity of a contact region between a first particle of the first type and a second particle of the first type, wherein at least a portion of the plurality of particles of the second type is attached to the first particle of the first type and the second particle of the first type.

In another embodiment, a stacked-surface arrangement includes a first surface and a second surface, wherein at least one of the first and second surfaces is a surface of an integrated circuit chip, the at least one surface comprising pads for electrically connecting the integrated circuit chip with solder balls, wherein the first and the second surface are essentially arranged in parallel for forming a gap region in between; and a bridging arrangement bridging arrangement for coupling a first terminal to a second terminal, the bridging arrangement comprising a plurality of particles of a first type forming at least one path between the first terminal and the second terminal, and a plurality of particles of a second type arranged in a vicinity of a contact region between a first particle of the first type and a second particle of the first type, wherein at least a portion of the plurality of particles of the second type is attached to the first particle of the first type and the second particle of the first type; the bridging arrangement being arranged in the gap region for thermally coupling the first surface and the second surface wherein the first surface corresponds to the first terminal and the second surface corresponds to the second terminal.

In another embodiment, a method for manufacturing a bridging arrangement between a first terminal and a second terminal includes placing a surface of the first terminal close to a surface of the second terminal for generating a contact region; applying a suspension comprising a carrier fluid and a plurality of particles of a second type in the contact region between the first and the second terminal; and removing the carrier fluid such that a plurality of particles of the second type arrange in a vicinity of the contact region between the first and second terminal, wherein at least a portion of the plurality of particles of the second type is attached to the surface of the first terminal and to the surface of the second terminal.

In another embodiment, a method for manufacturing a bridging arrangement between a first terminal and a second terminal includes providing at least one path of particles of a first type between the first terminal and the second terminal; applying a suspension comprising a carrier fluid and a plurality of particles of a second type in a region between the first and the second terminal; and removing the carrier fluid such that a plurality of particles of the second type arrange in a vicinity of a contact region between a first particle of the first type and a second particle of the first type, wherein at least a portion of the plurality of particles of the second type is attached to the first particle of the first type and the second particle of the first type.

In still another embodiment, a bridging arrangement includes a first terminal having a first surface and a second terminal having a second surface, wherein the first surface and the second surface are arranged close to another for forming a contact region; a plurality of electrically conducting particles arranged in a vicinity of the contact region, wherein at least a portion of the plurality of particles is attached to the first surface and to the second surface; wherein the contact region is surrounded by a plurality of the particles thereby forming an electrically conducting neck.

BRIEF DESCRIPTION OF THE SEVERAL VIEWS OF THE DRAWINGS

FIGS. 19 and 20 show examples for heat transport through necked attached microparticles between two surfaces.

FIG. 21 is a diagram illustrating the thermal conductivity of necked attached microparticles as a function of a particle filling factor and neck diameter.

DETAILED DESCRIPTION

Figure 1:
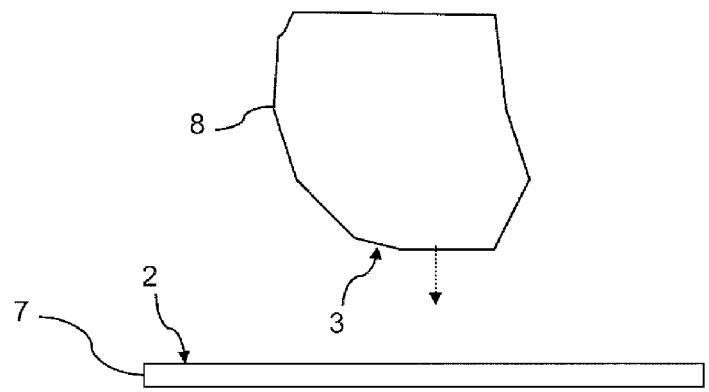
FIGS. 1-4 show schematic diagrams of an embodiment of a bridging arrangement and illustrate method steps involved in the manufacturing of a coupling of two terminals through a bridging arrangement.

In this disclosure, a bridging arrangement for coupling a first surface to a second surface is presented. Further, a method for manufacturing a bridging arrangement for coupling a first surface to a second surface is disclosed.

According to an embodiment of a first aspect of the invention, a bridging arrangement for coupling a first terminal to a second terminal comprises: a plurality of particles of a first type forming at least one path between the first terminal and the second terminal; and a plurality of particles of a second type arranged in a vicinity of a contact region between a first particle of the first type and a second particle of the first type, wherein at least a portion of the plurality of particles of the second type is attached to the first particle of the first type and the second particle of the first type.

A contact region is a region where the particles of the first type are closest to each other. For example, the contact region of two particles comprises a volume around the shortest distance of two neighboring particles. As a limiting case the contact region may be a point contact where two particles attach to each other. Preferably, the particles of the first type are not further apart from each other than a diameter of the particles of the second type. According to an embodiment, the particles of the first type are attached to each other. Then, the path formed by the particles of the first type can be considered a percolation path.

A terminal can be a surface, a boundary or a border of an object. For example, the bridging arrangement may bridge or couple two surfaces being extremities of objects such as chips or dies.

The bridging arrangement can be confined to a region, e.g. a gap between two surfaces. However, the bridging arrangement may also be a bulk material use for filling purposes.

The plurality of particles of the first type, in particular, may form a percolation path between the first surface and the second surface. When the particles of the first type are attached to each other or are in surface contact with each other, a continuous path between the first and second surface is provided.

According to an embodiment, the plurality of particles of the second type is arranged in a vicinity of such a point contact or in a contact region between the particles of the first type. The portion of particles of the second type may form at least one percolation path between surfaces of particles of the first type.

The particles of the second type may be smaller than the particles of the first type.

By having the portion of particles of the second type arranged and attached to the first particles and their contact region, the mechanical, thermal and/or electrical properties of the paths or bridges between the first and second surface can be adjusted. The embodied smaller particles of the second type, for example, may provide for additional contacts and paths from one particle surface to the other or from one surface to other particle surface.

In one embodiment of the bridging arrangement at least one contact region between a first particle of the first type and a second particle of the first type is surrounded by a plurality of particles of the second type. For example, a point contact between a first particle of the first type and a second particle of the first type may be enclosed by a plurality of particles of the second type. The particles of the second type may also form a neck around the contact region of the particles of the first type. The particles of the second type may also clasp around the contact region or contact regions. By surrounding the contact region, or preferably the point contacts, for example, an additional mechanical stability of the entire (percolation) paths realized by the particles of the first type can be achieved.

Further, a plurality of particles of the second type may form at least one percolation path between a surface of said first particle of the first type and a surface of second particle of the first type. Such a percolation path of particles of the second type can be situated along the shortest distance of two neighboring particles of the first type. By additional percolation paths which are realized by attached particles which may be attached particles of the first type or attached particles of the second type or a mixture of first and second type particles, physical properties of the bridging arrangement can be changed. For example one may achieve an improved heat dissipation or thermal conductance of the bridging arrangement by additional percolation paths in terms of the second type particles. Additional percolation paths through attached or contacted particles with each other may influence an electrical conductance of the bridging arrangement as well.

According to an embodiment, a diameter of the particles of the first type is larger than a diameter of the particles of the second type. For example, the diameter of the particles of the second type may be chosen so small as to allow the particles of the second type enter narrow gaps or regions in the vicinity of a point contact of first type particles.

In particular, the diameter of the particles of the second type may be less than one tenth of a diameter of the particles of the first type. Preferably, the diameter of the particles of the second type is less than 1/100 of a diameter of the particles of the first type. For example, a diameter of the particles of the first type may fall in the range between 1 and 50 μm. A diameter of the particles of the second type can be between 10 and 500 nm. However, other sizes can be contemplated. The particles of the first type may be referred to as microparticles, and the particles of the second type may be referred to as nanoparticles.

According to an embodiment, the particles of the first type and/or the particles of the second type have a spherical shape. For example, spheres can be dispersed easily in a carrier fluid thereby forming a suspension which can be useful for manufacturing a bridging arrangement.

According to some embodiments the particles of the second type arise from a molecular structure assembled in the vicinity of the contact regions of the first type particles. The arranged second type particles can form a polymer structure. The second type particles can also include silica from a sol gel process.

In one embodiment of the bridging arrangement, the bridging arrangement further comprises a material surrounding the particles of the first type and of the second type. For example, the material can be an epoxy resin which is rigid and stabilizes the network of paths formed by the particles of the first and/or second type. One may also consider a matrix for stabilizing the particles forming the bridging arrangement.

In another embodiment the particles of the first type and/or the particles of the second type are ferromagnetic particles. When using ferromagnetic particles, the manufacturing process of arranging the smaller second type particles in the vicinity of contact regions of the first type particles is enhanced. The process of manufacturing the bridging arrangement can become more efficient when ferromagnetic particles are used because an evaporation or drying step can be eliminated.

The first type particles or the second type particles may also have a dielectric coating. The dielectric coating can be used as an adhesive or a further support structure for enhancing the variety of the bridging arrangement in terms of the percolation paths of attached particles. The dielectric coating can be thermally conductive. An insulating coating also allows for the use of metallic particles, even if an electrical insulation of the composite material forming the bridging arrangement is needed.

In one embodiment of the bridging arrangement the particles of the first type and/or the second type particles are adapted to form a heat bridge between the first terminal and the second terminal. In particular, the materials of the particles of the first type and/or the second type can be chosen as to have a good thermal conductivity. The entire bridging arrangement can be a composite filler material for a gap between two surfaces.

In another embodiment of the bridging arrangement, the bridging arrangement is used as a thermal underfill in a stacked surface arrangement.

One embodiment of a stacked-surface arrangement includes a first surface and a second surface, wherein at least one of the first and second surfaces is a surface of an integrated circuit chip, the at least one surface comprising pads for electrically connecting the integrated circuit chip with solder balls, wherein the first and the second surface are essentially arranged in parallel for forming a gap region in between; and a bridging arrangement being arranged in the gap region for thermally coupling the first surface and the second surface. The bridging arrangement includes a plurality of particles of a first type forming at least one path between the first surface and the second surface; a plurality of particles of a second type arranged in a vicinity of a contact region between a first particle of the first type and the second particle of the first type, wherein at least a portion of a plurality of particles of the second type is attached to the first particle of the first type and the second particle of the first type.

The bridging arrangement may provide for a plurality of percolation paths and reliable thermal contacts between the particles of the first type. For example, necks of second type particles can build up and improve the thermal conductivity of the chains or paths of first type particles between the two surfaces.

In one embodiment of the stacked-surface arrangement the first and the second surface are spaced by solder balls.

In another embodiment of the stacked-surface arrangement the first surface and the second surface are surfaces of integrated circuit chips. For example, a plurality of integrated circuit chips can be placed on top of each other wherein an underfill between this integrated circuit chips includes several bridging arrangements.

According to an embodiment of another aspect of the invention, a method for manufacturing a bridging arrangement between a first terminal and a second terminal is provided.

One embodiment of method for manufacturing a bridging arrangement between a first terminal and a second terminal includes placing a surface of the first terminal close to a surface of the second terminal for generating a contact region; applying a suspension comprising a carrier fluid and a plurality of particles of a second type in the contact region between the first and the second terminal; and removing the carrier fluid such that a plurality of particles of the second type arrange in a vicinity of the contact region between the first and second terminal, wherein at least a portion of the plurality of particles of the second type is attached to the surface of the first terminal and the surface second terminal.

The method may be, for example, adapted to electrically couple two terminals and may replace conventional soldering techniques. For example, choosing electrically conducting nanoparticles as particles in the suspension can lead to a necking in the contact region. The first terminal is for example a copper pillar on a chip, and the second terminal is pad on a second chip or a printed circuit board. The method leads to a reliable connection between such elements. An optional sintering step of the conducting nanoparticles can be performed. Related annealing temperatures are lower than the reflow temperature needed to form a solder joint and result therefore in reduced structural chip package interaction. The method may also remedy defective soldered joints or junctions.

According to another embodiment there is provided a method comprising the steps of: providing at least one path of particles of a first type between the first terminal and the second terminal; applying a suspension comprising a carrier fluid and a plurality of particles of a second type in a region between the first and the second surface; and removing the carrier fluid such that a plurality of particles of the second type arrange in a vicinity of a contact region between a first particle of the first type and a second particle of the first type, wherein at least a portion of the plurality of particles of the second type is attached to the first particle of the first type and the second particle of the first type.

The step of providing may include: providing at least one percolation path of attached particles of the first type.

A terminal can be a surface, a boundary or a border of an object. For example, the bridging arrangement may bridge or couple two surfaces being extremities of objects such as chips or dies.

The characteristics of the particles of the first type and the particles of the second type may correspond to the features of the particles disclosed with respect to the bridging arrangement described above.

The step of removing the carrier fluid may be exchanged by the step of: applying a magnetic field in a direction from the first terminal or surface to the second terminal or surface. Then, according to an embodiment, the particles of the first type and the particles of the second type have ferromagnetic properties.

By applying a suspension including a carrier fluid and the particles of the second type, the particles of the second type may accumulate or arrange automatically at the contact regions. For example, the surface tension of the carrier fluid may enhance the aggregation or accumulation of the smaller particles of the second type close to the contact regions. The method may realize a self-assembly of the second type particles or nanoparticles.

The step of removing may comprise drying or evaporating the carrier fluid at least partially.

In one embodiment of the method, the carrier fluid is removed such that capillary forces of the carrier fluid arrange suspended particles of the second type in the vicinity of the point contact or in a contact region between the first particle of the first type and the second particle of the first type.

According to an embodiment, the suspended particles of the second type do not sediment in the carrier fluid. Accordingly, the carrier fluid viscosity, the particle diameter and density of the second particle are selected. For example, the suspension may be a colloid suspension.

According to another embodiment of the method the second type of particles are at least partially dissolved in the carrier fluid. The suspension can comprise an epoxy and/or a sol gel material. Eventually, an epoxy material can stabilize the arrangements of the second type particles.

In yet another embodiment the particles of the second type are applied in connection with a sol gel process. In particular, the particles of the second type can be polymer networks. For example, the particles of the second type may include alkoxides and/or siloxane. The particles of the second type may form macromolecules. The method may further comprise the step of filling void space between the particles of the first type and the particles of the second type in the region between the first terminal and the second terminal with a resin. For example, an epoxy resin may harden and form a rigid matrix structure for the (percolation) paths of the nanoparticles or microparticles forming the bridging.

In a variant of the method, the step of providing at least one path comprises: applying a further suspension comprising a further carrier fluid and particles of the first type in the region between the first and the second terminal; and withholding particles of the first type by means of a barrier element in the region between the first surface and the second surface for forming the percolation path of attached particles between the first terminal and the second terminal.

The terminals may be surfaces at predetermined distances from each other thereby forming a gap region between them.

The further suspension may comprise the further carrier fluid, which can be, for example, water and microparticles which may have spherical shape but can also have an irregular shape. A barrier element may be generally permeable for the carrier fluids but at least partially impermeable for the microparticles, i.e. the barrier prevents particles of the first type from passing. Hence, withholding microparticles by means of a barrier element, as for example by a filter element or other obstructing elements in the gap region or sedimentation of microparticles at a gap outlet, leads to an agglomeration of microparticles in the gap. In particular, microparticles can become attached to each other and form a (percolation) path of attached microparticles between the first surface and the second surface.

In one embodiment of the method, the step of applying the further suspension may comprise: generating a flow of the further suspension along the gap region from an inlet to an outlet. The further suspension has preferably a viscosity that allows a flow along the gap region. Embodiments of the method may allow for a quick and efficient filling by means of a suspension and convective forces.

In another embodiment, the step of withholding at least partially particles of the first type comprises: filtering the suspension in the gap region. By filtering, the filter feed may comprise the further suspension with the further carrier fluid and the particles of the first type while the filtrate essentially contains the further carrier fluid while the particles of the first type are withheld. For example, a filtering element can be provided as a barrier element in the gap region.

Additionally, the method may comprise the step of removing residual further carrier fluid from the region between the first surface and the second surface after withholding particles of the first type. As a result of the step of withholding the particles of the first type, attached particles between the first and the second surface can be created. Such percolation paths can be spaced by void regions in the gap region. One may remove the residual further carrier fluid, for example, by rinsing or increasing the temperature and thereby evaporating the liquid. The step of removing may therefore comprise a process of rinsing, increasing the temperature, reducing a pressure, evaporating and/or drying.

In another embodiment of the method the suspension and the further suspension are applied contemporaneously. For example, one may use a unique colloidal suspension containing a single carrier fluid material and particles of the first type and particles of the second type. While the particles of the first type would be stacked and form paths connecting the first and second terminal, the second type particles can accumulate or aggregate in the contact regions of the first type particles when the carrier fluid of the suspension is removed, for example, by slow evaporation. Capillary forces provide for an automatic arrangement of the smaller second type particles around the contact regions of the first type particles, for example, thereby forming necks.

Preferably, a filling factor of microparticles in the further carrier fluid of the applied suspension is between 0 vol % and 10 vol %. More preferable the filling factor or volume concentration of the microparticles is between 0.5 and 2 vol %. Alternatively the volume concentration is between 0.5 and 5 vol %. Even more preferred the volume concentration is between 2 and 5 vol %.

In certain embodiments the concentration or volume filling factor of the microparticles in the further suspension is between 0 and 0.1 vol % and even more preferably between 0 and 0.01 vol %. The lower the concentration of particles the lower is the viscosity of the suspension. Hence, a flow in the gap can be easier generated.

The above-mentioned method can be suitable for manufacturing an underfill for a stacked-surface arrangement, such as a flip-chip device or stacked integrated circuit chips.

According to an embodiment, a filling or underfill comprising bridging arrangements is a thermally conducting filling. For example, the resulting thermal conductivity may be sufficient to provide for a reliable heat transport from the first to the second surface if the surfaces are part of a chip flip arrangement. The resultant thermally conducting filling can be an underfill between the surface of a substrate and the surface of an electronic element such as an integrated circuit chip, e.g. a microprocessor.

This disclosure further proposes a stacked-surface arrangement wherein the bridging arrangement in the region between the first surface and the second surface is manufactured according to a method as explained above.

Yet another embodiment of a bridging arrangement comprises: a first terminal having a first surface and a second terminal having a second surface, wherein the first surface and the second surface are arranged close to another for forming a contact region; a plurality of electrically conducting particles arranged in a vicinity of the contact region, wherein at least a portion of the plurality of particles is attached to the first surface and to the second surface; wherein the contact region is surrounded by a plurality of the particles thereby forming an electrically conducting neck.

The first terminal may be for example a pad or lead of a chip, and the second terminal may be a circuit path or stripline. The bridging arrangement may lead to a reliable connection between such elements without the need for lead or brazing solder. The bridging arrangement can comprise solder balls as terminals, wherein the neck of particles enhances the electrical connectivity with a conductor path or the like. The particles may be in particular nanoparticles.

Certain embodiments of the presented bridging arrangement and the methods for manufacturing a bridging arrangement in a region between a first surface and a second surface or of the presented stacked-surface arrangement may comprise individual or combined features, method steps or aspects as mentioned above or below with respect to exemplary embodiments.

In the following, embodiments of bridging arrangements and methods and devices relating to the manufacture of bridging arrangements are described with reference to the enclosed drawings.

Like or functionally like elements in the drawings have been allotted the same reference characters, if not otherwise indicated.

As used herein, the term "particles" refers to particles of essentially any shape that can be used for filling a void space. The filling particles can be small pieces or bits of a solid material. The particles can be embedded in a matrix. Although the figures show idealized ball-like particles of spherical shape other geometrical structures for the nanoparticles or microparticles can be contemplated.

The term "microparticles" is used for particles of a first type, and the term "nanoparticles" is used for particles of a second type. Generally, the particles of the first type and the second type differ in their size. The dimensions of particles of the second type (nanoparticles) are chosen such that they may enter reasonably into gaps between attached particles of the first type (microparticles).

"Withholding" essentially refers to keeping an item, as for example a filler particle, at least locally from moving freely. It is understood that withholding may also refer to restraining, arresting, blocking its way, stopping a particle, or obstructing a particle's trajectory. For example, a sieve withholds a particle from a suspension running through the sieve thereby preventing the particle from passing the sieve.

The term "attached", in particular with regard to attached particles, refers to particles that have a surface contact with each other. Attached particles, e.g. touch each other.

The term "contact region" refers to a region in the direct vicinity of the shortest distance between two neighboring surfaces, in particular surfaces of particles forming paths. A contact region, for example, between two spherical particles having each a particle diameter and being spaced apart from each other by one tenth to on twentieth of their particle diameter comprises a region where the surfaces of the particles are closest to each other. A vector of the shortest distance may be considered an axis of a cylinder volume limiting the contact region.

FIGS. 1-4 show schematic diagrams of an embodiment of a bridging arrangement and illustrate the method steps involved in the manufacturing of a coupling of two terminals through a bridging arrangement.

Figure 4:
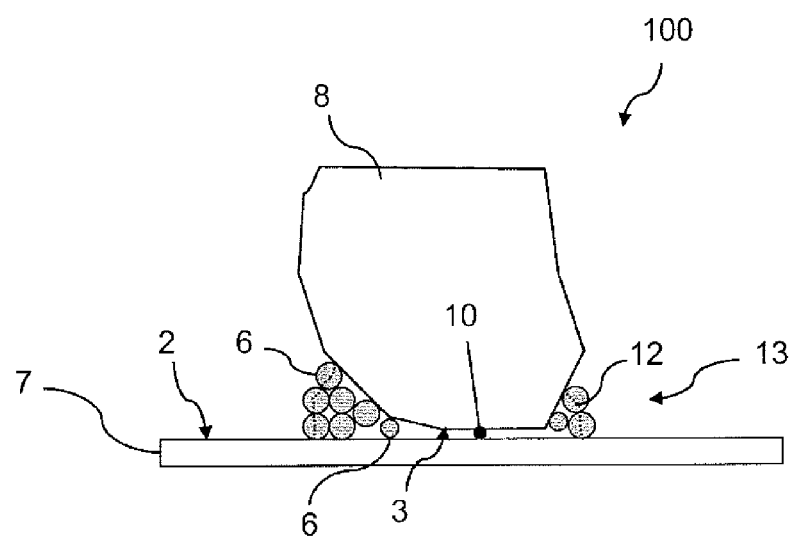

In FIG. 4, a bridging arrangement 100 produced by the method is shown. The bridging arrangement 100 comprises a first and second terminal 7, 8 each having a surface 2, 3. The first terminal 7 is a strip line of a circuit board, and the second terminal is a pad, lead or pillar 8 of an electronic component or chip. The surfaces 2, 3 are close to each other, and can be attached to each other. However, it is sometimes difficult to place the surface in contact with each other. Hence, there is a contact region 10. Around the contact region 10 a plurality of electrically conducting nanoparticles 6 are arranged. The particles may be silver particles, for example, having diameters in a range between about 10 nanometers (nm) and 100 nm. The nanoparticles form a neck 13 around the contact region 10 thereby providing a stable conducting connection between the pad 8 and the circuit line 7. The attached particles 6 can undergo an annealing process leading to a better mechanical and electrical stability. For example, some nanoparticles form a percolation path 12 from the circuit board surface 2 to the surface 3 of the pad 8.

The bridging structure 100 can also enhance an electric connection between copper pillars and the respective strip line on a printed circuit board, through a pad. For example, the upper terminal 8 can be considered a copper pillar or solder ball, and the lower terminal 7 can be considered the strip line.

For producing the bridging arrangement 100, first, as illustrated in FIG. 1 the first and second terminal, or the pad 8 and the circuit board or line 7, respectively, are placed close to each other. This is indicated by the vertical arrow in FIG. 1. As a result, shown in FIG. 2, a contact region 10 is created where the surfaces 2, 3 are closest to each other. The surfaces 2, 3 may be curved, such that a narrowing gap towards the center of the contact region 10 develops.

Figure 2:
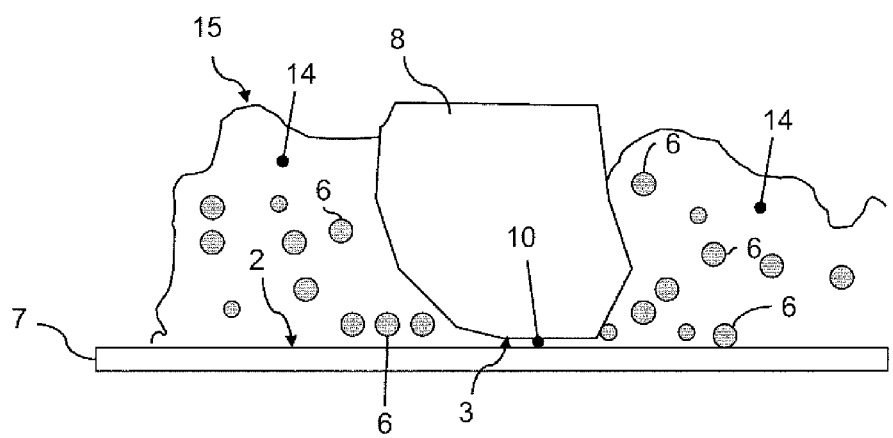

Next, a suspension is applied so as to cover at least the contact region 10. The suspension contains a carrier fluid 14 and the silver nanoparticles 6. The surface 15 of the suspension droplet is shown in FIG. 2. Due to the surface tension, the fluid arranges on the surfaces of the system.

Figure 3:
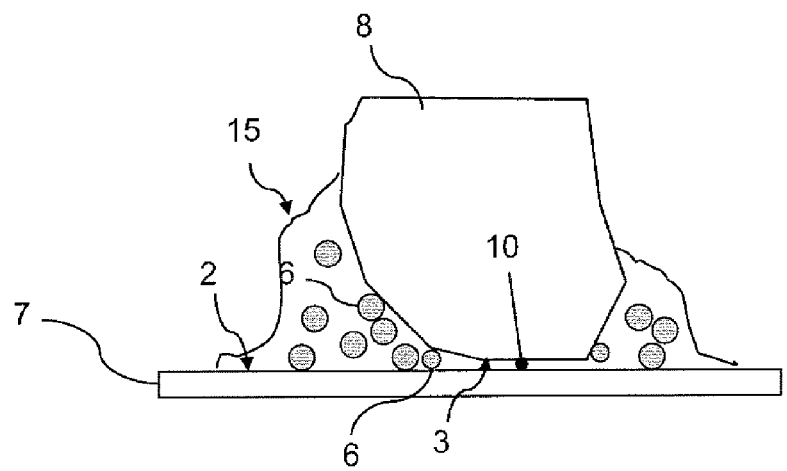

In a next step the carrier fluid 14 is gradually removed such that the concentration of nanoparticles 6 increases in the suspension. At the same time, due to capillary forces or surface tension, the droplet arranges in the narrowest locations of the system, at the contact region 10. This is shown in FIG. 3. By further removing fluid, e.g., by evaporation, the nanoparticles accumulate in terms of a neck 13 around the contact region 10. The neck formation is assisted by the shrinkage of the carrier fluid surface 15. The surface 15 confines the dispersed nanoparticles 6 and places them around the contact region 9.

The process leads to reliable connection between the pillar 8 and the strip 7 without necessarily soldering. One may contemplate that the method comprising the application of suspended electrically conducting nanoparticles and the surface-tension assisted necking replaces or complements conventional soldering techniques.

Figure 5:
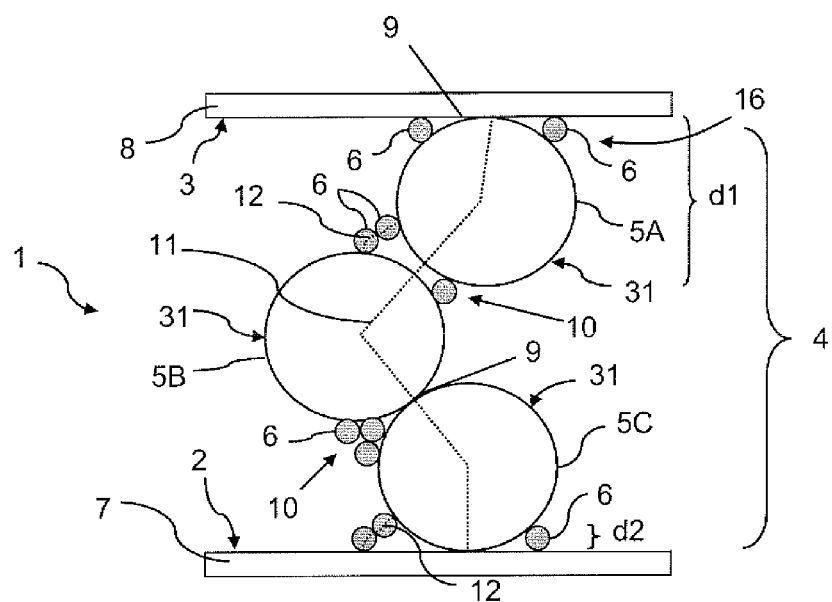
FIG. 5 shows a schematic diagram of a first embodiment of a bridging arrangement.

FIG. 5 shows a schematic diagram of a first embodiment of a bridging arrangement. The bridging arrangement 1 provides for a contact of a first surface 2 as a first terminal with the second surface 3 as a second terminal. For example, a bridging device 1 may provide for an electric or thermal contact between the surfaces 2, 3. FIG. 5 shows a first surface 2, which can be, for example, the upper surface of a substrate 7. The second surface 3 can be a surface of an integrated circuit chip 8. Between the lower surface 2 and the upper surface 3 is a gap region 4.

The bridging device 1 comprises a plurality of particles 5 of a first type. The particles 5 of the first type have a relatively large diameter d1, for example d1 is in a range between 1 and 100 μm. The particles of this type are also referred to as microscopic particles or microparticles. FIG. 5 shows three microscopic particles 5A, 5B and 5C which are close to each other at contact regions 9, 10. The upper and the middle microscopic particle 5A, 5B do not touch each other but are close enough to have nanoparticles 6 bridge the gap in between. The middle microscopic particle 5B and the lower microscopic particle 5C have as contact region 9 a common point contact 9. The upper and lower microscopic particles 5A and 5C also touch with the lower and upper surface 2, 3, respectively.

The microscopic particles 5A, 5B, 5C form a path 11 which is indicated by the dotted line 11. One may speak of a percolation path 11. The percolation path 11 connects the two surfaces 2, 3. In order to enhance, for example, a thermal transfer between the first surface 2 and the second surface 3, additional smaller particles 6 of a second type are provided. The particles 6 of the second type have a considerable smaller diameter d2, for example, one tenth of the diameter d1. The smaller particles 6 of the second type are referred to as nanoparticles 6. The nanoparticles 6 are arranged in the vicinity of the point contacts 9 or the contact region 10 of the micro particles 5. Further, the nanoparticles 6 are arranged in the gaps or contact regions 16 of the microparticles 5 touching or contacting the surfaces 2, 3.

The nanoparticles 6 are arranged as to contact the surface 31 of two attached microparticles 5A, 5B. For example, there is one nanoparticle 6 arranged in the gap between the upper microparticle 5A and the middle microparticle 5B. Further, in the contact region of the upper microparticle 5A with the middle microparticle 5B, there is a percolation path 12 formed by two nanoparticles 6. Similarly, there is a percolation path 12 formed by two nanoparticles 6 between the lower surface 2 and a surface 31 of the lower microparticle 5C. All these contacts and percolation paths 11, 12 of the microparticles 5 and/or the nanoparticles 6 lead to an improved thermal conductivity of the bridging device 1 comprising the micro- and nanoparticles. The arrangement of nanoparticles 6 in the contact regions 10 where the microparticles 5 are close to or attached to each other may also lead to improved mechanical properties of the bridging arrangement 1. The nanoparticles may stabilize the contact points 9 or contact regions 10 of the microparticles 5. The micro- and/or nanoparticles 5, 6 can be annealed to each other, for example, if the particle materials are metals.

Figures 6A, 6B:
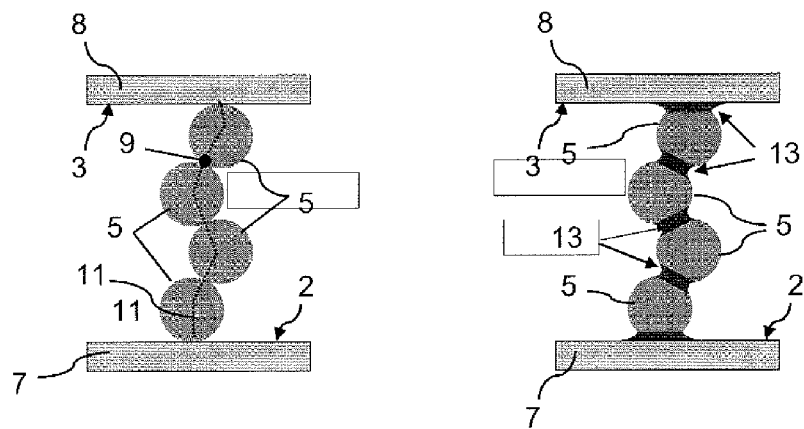
FIGS. 6A and 6B show a schematic diagram of a second embodiment of a bridging arrangement.

FIG. 6 shows a schematic diagram of a second embodiment of a bridging arrangement. FIG. 6A first shows a percolation path 11 formed by four microparticles 5 which are attached to each other between a first surface 2 and a second surface 3. For example, the first surface 2 can be the surface of a substrate and a second surface 3 can be the surface 3 of an integrated circuit chip 8. FIG. 6A shows the percolation path 11 with point contacts 9 between the microparticles 5.

FIG. 6B on the right hand side shows the same geometry with accumulated nanoparticles 6 in the contact regions 9. The size of the nanoparticles 9 is chosen such that the nanoparticles 9 can easily accumulate in the gap regions or the regions close to the point contacts 9. The nanoparticles 6 form necks 13 that efficiently increase the contact between the microparticles 5 and lead to an improved contact property of the entire bridging between the first surface 2 and the second surface 3. The nanoparticles 6 surround the point contacts 9 between the microparticles 5 in a ring-like fashion. The necks 13 stabilize the percolation path mechanically and enhance the electric and/or thermal conductivity of the bridge between the substrate 7 and the integrated circuit chip 8.

Figure 7:
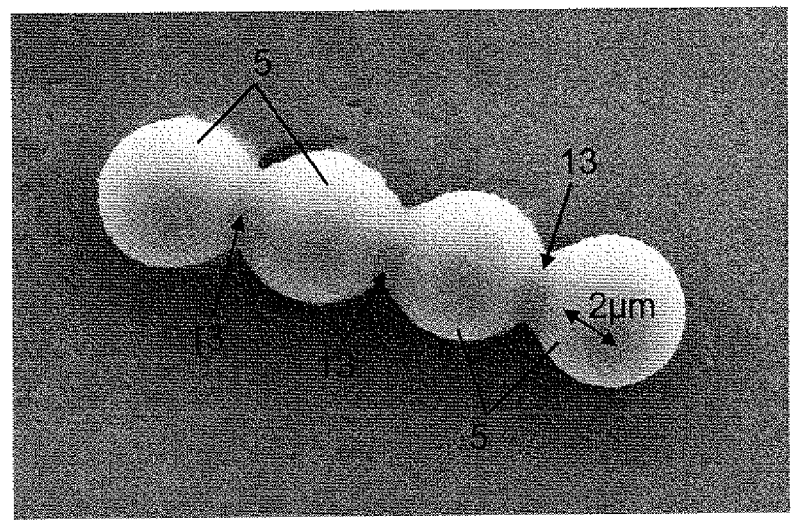
FIG. 7 shows a microscopic image of a structure comprising attached microparticles according to an embodiment of a bridging arrangement.
Figure 8:
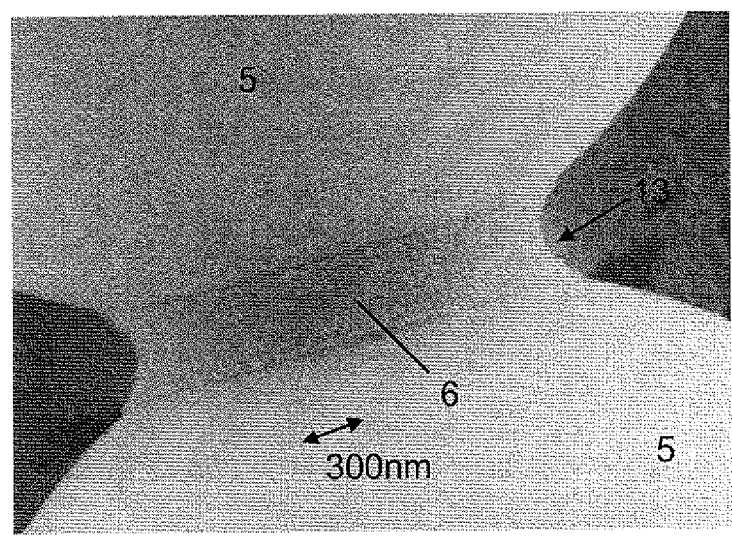
FIG. 8 shows a microscopic image of a detail in a structure comprising attached microparticles according to an embodiment of a bridging arrangement.

FIG. 7 shows a microscopic image of a structure comprising attached microparticles with neck-forming nanoparticles. FIG. 7 shows four attached microparticles 5 having a spherical shape. In the contact region, necks 13 composed by nanoparticles can be seen. The diameter d1 of the microparticles 5 is roughly 6 μm, and the diameters d2 of the nanoparticles accumulated in the gap or contact regions have a much smaller diameter d2. This can be seen in more detail in FIG. 8. FIG. 8 shows a neck detail between two microparticles 5. The nanoparticles 6 which are also spherical have a diameter of roughly d2=50 nm. The shape of the neck 13 as illustrated in FIG. 8 is similar to the shape of a fluid droplet placed between two particles. The ring or neck 13 of the nanoparticles 6 corresponds roughly to a surface shape of a liquid between two spherical microparticles 5 due to its surface tension.

Figure 9:
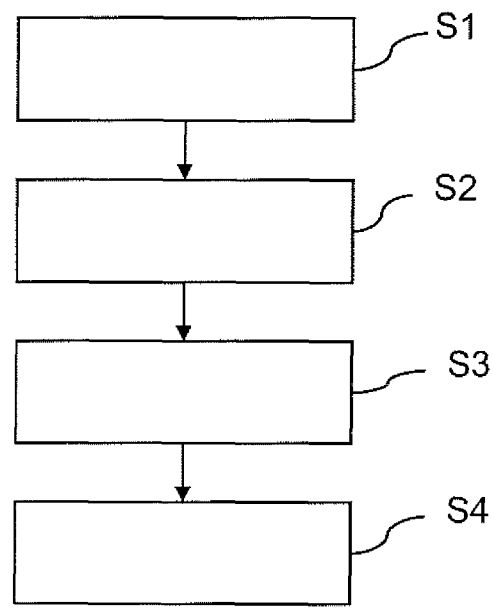
FIG. 9 shows a flow chart for an embodiment of a method for manufacturing a bridging arrangement.

One may employ the forces due to the surface tension of a carrier fluid in a suspension for realizing an advantageous arrangement of the nanoparticles in terms of shoulders or necks at contact points between the microparticles. FIG. 9 shows a flow chart for an embodiment of a method for manufacturing a bridging arrangement. FIGS. 10 through 15 illustrate process steps involved in a manufacturing method for a bridging device.

Figure 10:
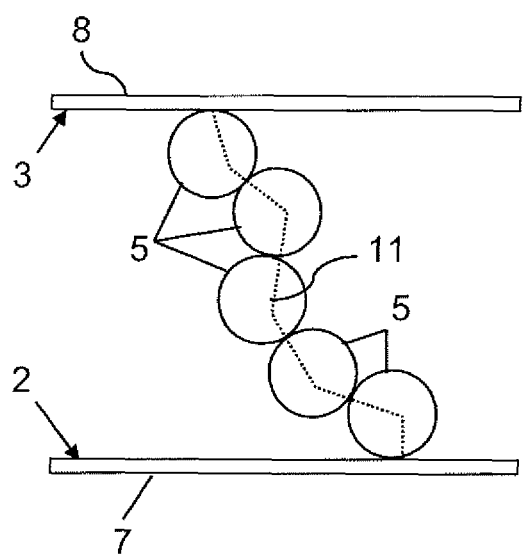
FIGS. 10-15 show schematic diagrams of an embodiment of a bridging arrangement and illustrate method steps involved in the manufacturing of a coupling of two surfaces through a bridging arrangement.

In a first step S1 a (percolation) path of attached particles of a first type, for example microparticles, are provided between a first surface and a second surface. This is illustrated in FIG. 10 showing a lower first surface 2, for example, of a substrate 7, and an upper surface 3, for example, of an IC chip 8. In FIG. 10 a path of attached microparticles 5 thereby forming a percolation path 11 is shown. Further below, potential methods and processes for providing such a percolation path 11 of microparticles 5 are explained. The rudimentary structure of percolated microparticles 5 between the lower surface 2 and the upper surface 3 itself may be considered a bridging arrangement or bridging device between the lower and upper surface 2, 3. However, for example, a charge transport from the lower to the upper surface 2, 3 or a thermal transport through the gap region 4 between the lower and upper surface 2, 3 can be considerably improved by increasing the number of contact points between the microparticles 5. This is achieved by nanoparticles.

Figure 11:
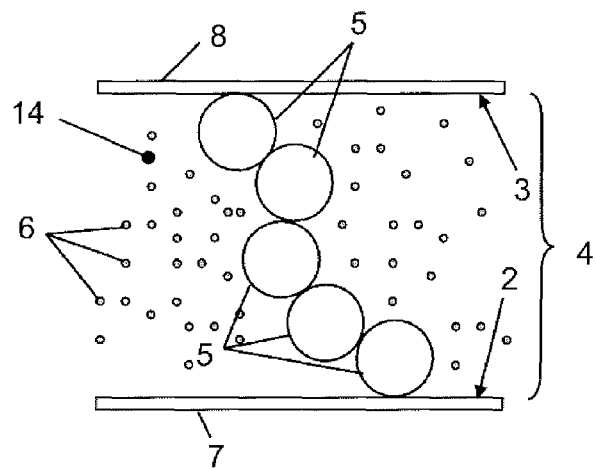

For accumulating nanoparticles at the contact points, as shown for example in FIG. 5, in the next method step S2, a suspension, for example, a colloid suspension comprising a carrier fluid and a plurality of particles of a second type, such as nanoparticles, is applied in the gap region between the two surfaces 2, 3. FIG. 11 shows the percolation path structure of attached microparticles 5 between the two surfaces 2, 3 and a suspension of a viscous carrier fluid 14 with immersed or dispersed nanoparticles 6. The viscosity of the carrier fluid 14 and the specific weight and size of the nanoparticles 6 is chosen such that during the process no sedimentation of the nanoparticles 6 occurs. Preferably, the colloidal suspension may flow into a gap region which is partially filled by the percolation paths of microparticles 5. For example, the viscosity of the carrier fluid 14 is less than 15 cp (centi Poise).

In some embodiments, the nanoparticle diameter d2 ranges between 10 and 500 nm and is preferably one hundredth of diameter d1 of the microparticles ranging, for example between 1 and 50 μm. The micro- and/or nanoparticles may comprise, for instance, polystyrene, silicon dioxide, aluminum dioxide, magnesium oxide, zinc oxide, silicon germanium gallium arsenide, barium nitride, aluminum nitride, silicon carbide, indium nitride, copper, aluminum, silver, gold, carbon, nickel or iron. Other materials can be contemplated and are preferably chosen according to the functional desired properties of the bridging arrangement.

In a next step S3, the carrier fluid 14 is at least partially removed from the gap region between the two surfaces 2 and 3. For example, one may rinse the carrier fluid. As a result, for example illustrated in FIG. 12, due to the surface tension of the carrier fluid 14, the fluid attaches to the surfaces 2 and 3 and to the surfaces 31 of the microparticles 5. Since the nanoparticles 6 are immersed or dispersed in the carrier fluid 14, also the nanoparticles 6 arrange close to the surfaces 2, 3, 31. For energetic reasons the fluid 14 prefers narrow gaps, for example, at the contact points between the microparticles 5. The surface tension or capillary forces make the surface 15 of the carrier fluid 14 envelope the percolated microparticles 5.

Figure 13:
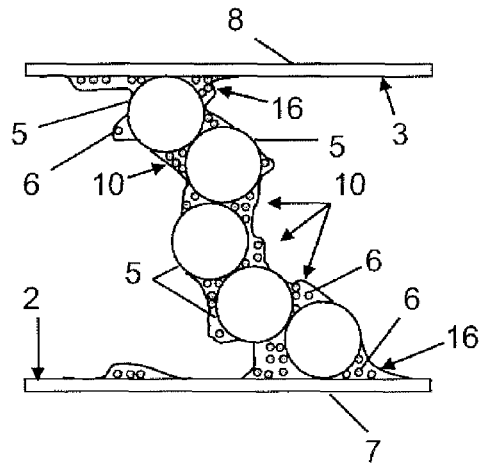

Further removing the carrier fluid of the suspension, for example, by drying or evaporating, the surface 15 of the carrier fluid 14 shrinks around the percolated microparticles. As a result, the particle density of nanoparticles 6 within the suspension increases. FIG. 13 shows how the nanoparticles 6 agglomerate in the contact regions 10 where the microparticles 5 are attached to each other and in contact regions 16 where microparticles 5 touch the surfaces 2, 3.

Figure 14:
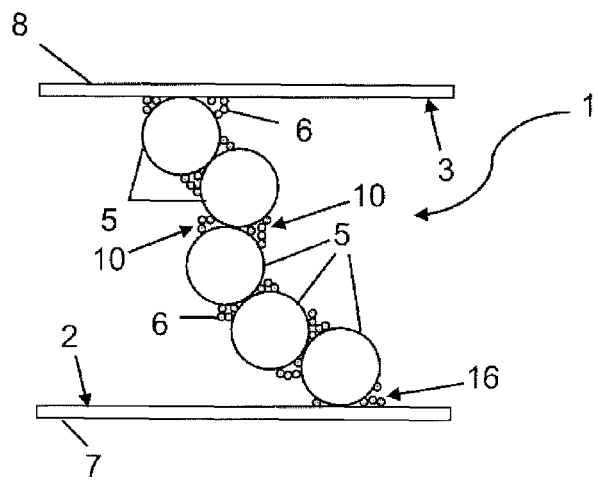

During the process of removing the carrier fluid 14 one may heat the structure thereby completely evaporating the carrier fluid 14. As a result a bridging arrangement 1 as shown in FIG. 14 is produced. For example, the carrier fluid may comprise water, alcohol or organic fluids such as xylene, epoxy resin, or acetone. The evaporation then can be achieved rapidly. Hence, the embodiment of a method for producing or manufacturing a bridging structure as shown in FIG. 14 can be done in a time-efficient manner. But boiling, with associated bubble formation should be prevented. During evaporation of the carrier fluid, the temperature is adapted such that the fluid or liquid does not boil, and the formation of bubbles is prevented. The temperature during the removing step S3 is, for example, considerably less than the boiling point of the carrier liquid.

During evaporation of the carrier fluid 14 the particles 6 of the second type stay preferably in the suspension resulting in a steadily increasing particle fill fraction. This is in particular true if the particles 6 are wetted well by the carrier fluid 14 and results in a reduction of surface free energy. If, in addition, the carrier fluid 14 wets the surfaces well, carrier fluid 14 will bridge cracks or tiny gaps until the very end of the evaporation process being energetically favorable. Accordingly, the second particles 6 are preferentially assembled at these locations. In the presence of surfaces 2, 3 and first particles 5, tiny gaps may exist between a surface 2, 3 and such particles 5, as well as between particles 5, where the second particles 6 arrange.

Bubble formation by boiling during the carrier fluid evaporation process can result in an unspecific particle assembly and is therefore preferably prevented.

Figure 12:
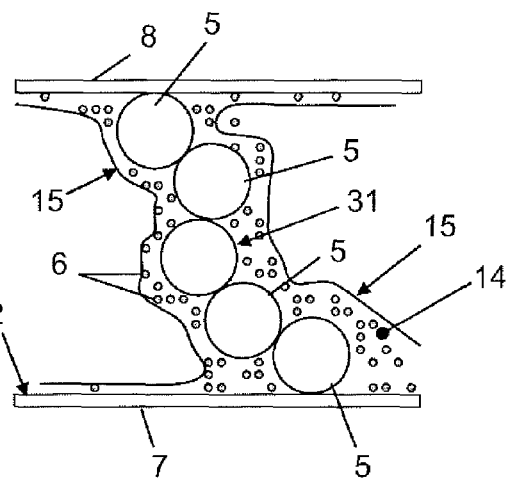

Referring further to FIGS. 11-13 one may fill the entire region 4 between the surfaces 2, 3 with the suspension. However, since the actual eventual neck formation only depends on the surface tension and the interaction of the carrier fluid with the microparticle surface it can be sufficient to wash the gap 4 with the suspension 6, 14. For example, one can place a certain amount of nanoparticle suspension 6, 14 onto the matrix of microparticles 5 and let capillary forces act. Then, under influence of the surface tension a wetting of the microparticle surfaces occurs.

As an optional step, S4 the produced structure comprising attached microparticles 5 and terms of percolation paths with nanoparticles 6 forming necks around the contact regions between the microparticles or the microparticles and the surface walls a locking process can be performed. If the particles 5, 6 are, for example, metallic particles, the structure can be cured or reinforced by means of an annealing process. Annealing may result in a more rigid bridging structure 1.

Figure 15:
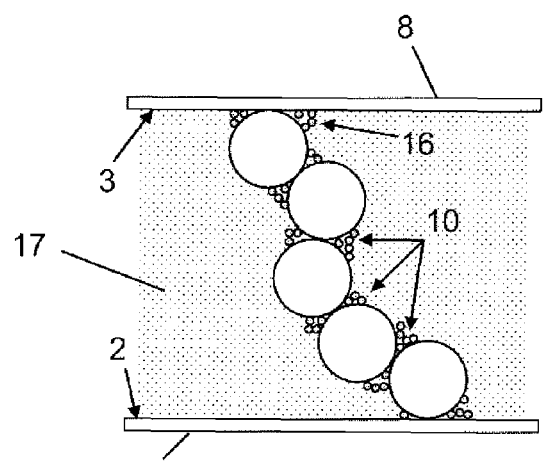

Alternatively or combined with an annealing process, the bridge of nano- and microparticles can be locked by inserting a filling in the void regions between the two surfaces 2, 3. FIG. 15 shows a bridging arrangement where the voids in the gap 4 are filled with an epoxy 17. Providing a filling material may comprise the steps of applying an epoxy resin in the gap region and curing the epoxy 4 for making it rigid.

Figure 17:
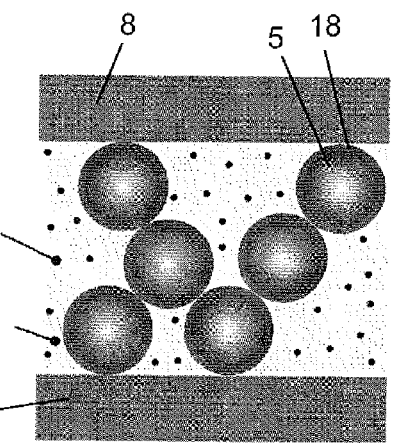
Figure 18:
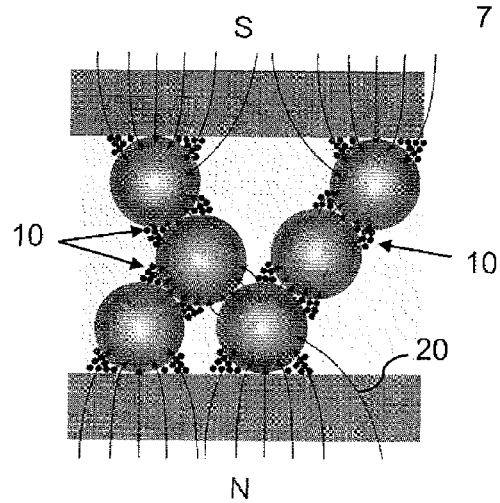

The proposed embodiment of a method provides for a self-arrangement of micro- and nanoparticles leading to a robust filling of a gap region. While the use of surface tension or capillary forces require a shrinking of the surface of the carrier fluid, one may also create attractive forces for nanoparticles in the narrow regions where the microparticles are attached to each other by electric or magnetic forces. For example, FIGS. 16 through 18 show schematic diagrams of a further embodiment of a bridging arrangement and illustrates method steps involved in the manufacturing of a bridging arrangement employing magnetic particles.

Figure 16:
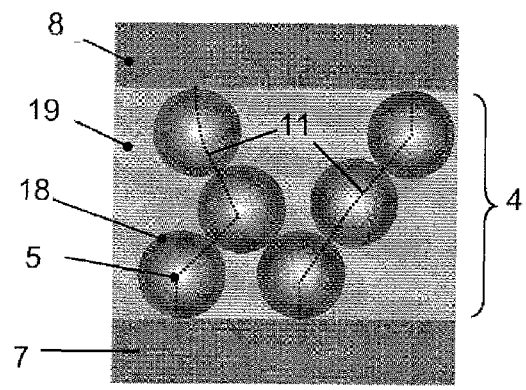
FIGS. 16-18 show schematic diagrams of a further embodiment of a bridging arrangement and illustrates method steps involved in the manufacturing of a coupling of two surfaces through a bridging arrangement.

FIG. 16 shows a section of a gap region 4 between two surfaces 2, 3 of, for example, silicon substrates 7, 8. For example, a bridging or underfill between the two surfaces 2, 3 is desired for enhancing the thermal transport between the substrate 7 and 8.

First, as shown in FIG. 16, a particle bed or percolation paths of stacked microparticles 5 is formed. The microparticles 5 have a ferromagnetic core and a dielectric coating 18. The ferromagnetic microparticles 5 can be applied to the gap region 4 by convective transport in terms of a suspension in a carrier fluid 19. By using ferromagnetic microparticles 5 and a magnetic field along the gap region, the microparticles 5 attached to each other more easily. Hence, a network of percolation paths 11 is formed between the first surface 2 and the second surface 3. The microparticles 5 can be magnetic as well such that they attach to each other more or less automatically.

Next, ferromagnetic colloids or nanoparticles 6 are inserted in the gap region. The nanoparticles 6 shown in FIG. 17 are also ferromagnetic and suspended in the carrier fluid 14. In principle, the colloids or nanoparticles 6 can be applied contemporaneously with the microparticles 5 in the same carrier fluid. Due to their ferromagnetic properties, the magnetic field gradients between the microparticles 5 in the contact regions than in the void spaces between the microparticles 5. This is illustrated in FIG. 18 where magnetic field lines 20 are shown. Additionally, a magnetic field with a north pole N and south pole S can be applied as illustrated.

Since the magnetic field strength is enhanced in the neck regions or the regions where the microparticles 5 are attached to each other, the ferromagnetic nanoparticles 6 agglomerate there. In FIG. 18 the nanoparticles are shown as dark dots in the contact regions 10. Hence, in the contact regions 10 nanoparticles form necks or rings in touch with the microparticles 6. Since the dielectric coating 18 of the microparticles 5 is thermally conductive, a variety of conduction paths for the heat, for example from the bottom to the top surface is provided.

In an optional curing step the viscous matrix of the carrier fluid for the nanoparticles becomes rigid and supports the bridging structures. It may be advantageous in the event that the carrier fluid does not need to be removed but can be used as a viscous matrix for the nanoparticles and as a solidified matrix of the curing contemporaneously.

One can also contemplate of electrically charged micro- and/or nanoparticles that lead to an attractive electric field configuration for nanoparticles to accumulate in the neck regions.

Alternatively or additionally, the thermal conductive dielectric coating can be used as an adhesive improving the contacts between the microparticles after curing.

The formation of a neck by nanoparticles can have a significant effect on the effective thermal conductivity of the bridging device or arrangement. The effective contact region between the microparticles is enhanced or increased by the accumulated nanoparticles in touch with each other and in contact with the microparticles in the contact regions. FIGS. 19 through 21 illustrate the influence of the necking by nanoparticles on the thermal conductivity in terms of a heat conduction model.

In investigations of the applicant a heat conduction model is used where two silicon plates 7, 8 are spaced by 15 μm. A heat flux and temperature boundary conditions are assumed for the silicon top and bottom plate. The model involves two microparticles 5 having a spherical shape with a diameter corresponding to one half of the gap, i.e., $d1=7.5$ μm. The two microparticles 5 are in point contact to each other and have an assumed thermal conductivity of $kp=46$ W/(mK). The assumed value for thermal conductivity for example corresponds to an $Al_2O_3$ sphere. The neck 13 made of nanoparticles is modeled as a cylindrical shape with a neck diameter dn and a thermal conductivity of $kn=46$ W/(mK). As a surrounding matrix, an epoxy resin having a thermal conductivity of $ke=0.2$ W/(mK) is assumed. The effective thermal conductivity of the bridging structure comprising two $Al_2O_3$ spheres with a neck in between is given in FIG. 21. FIGS. 19 and 20 show the geometric model configuration. In FIG. 19, a cubic dense packing of the microparticles assumed where the pitch corresponds to the microparticle diameter $d1$. In FIG. 20, a cubic $d1$-spacing with a pitch of $2d1$ is assumed.

FIG. 21 shows the efficient thermal conductivity keff as a function of the microparticles fill factor (x axis) and as a function of the neck diameter. Curve C1 corresponds to a neck diameter of $dn=2$ μm and $kn=kp$. Curve C2 corresponds to a neck diameter $dn=3$ μm and $kn=kp/4$. Curve C3 corresponds to a neck diameter $dn=3$ μm and $kn=kp/2$. Curve C4 corresponds to a neck diameter of $dn=3$ μm and $kn=kp$. Curve C5 corresponds to a neck diameter of $dn=4$ μm and $kn=kp$. The triangles correspond to a system having double size, i.e. $dn=6=3$ μm and $kn=kp$, but $d1=15$ μm.

It may be seen from the curves that by increasing the neck diameter dn and thereby increasing the number of nanoparticles accumulated in the contact regions 13, the total efficient thermal conductivity is enhanced. Further, the efficient thermal conductivity is invariant with respect to geometrical scaling. FIG. 21 also illustrates that from cubic dense packing to a cubic spaced packing the thermal conductivity decreases.

For improving the thermal, mechanical, geometrical or electric properties of the necks, in particular metallic nanoparticles can be used and further treated after forming the necks. For example, one may contemplate of a subsequent sintering step at relatively low temperatures. For example, a sintering process as 150° C. may be suitable for silver nanoparticles and can improve the neck properties. By solidifying the necks or the nanoparticles forming the neck, the entire bridging structure becomes more rigid.

Additionally or alternatively, the nanoparticles may be employed as catalysts in additional plating processes. For example, one may deposit nickel onto the nanoparticles for increasing the neck diameter. One may also contemplate of functionalizing the nanoparticles for improving the adhesive, thermal or electrical transport properties. In particular, the nanoparticles but also the microparticles can be supplied with a coating.

Figure 22:
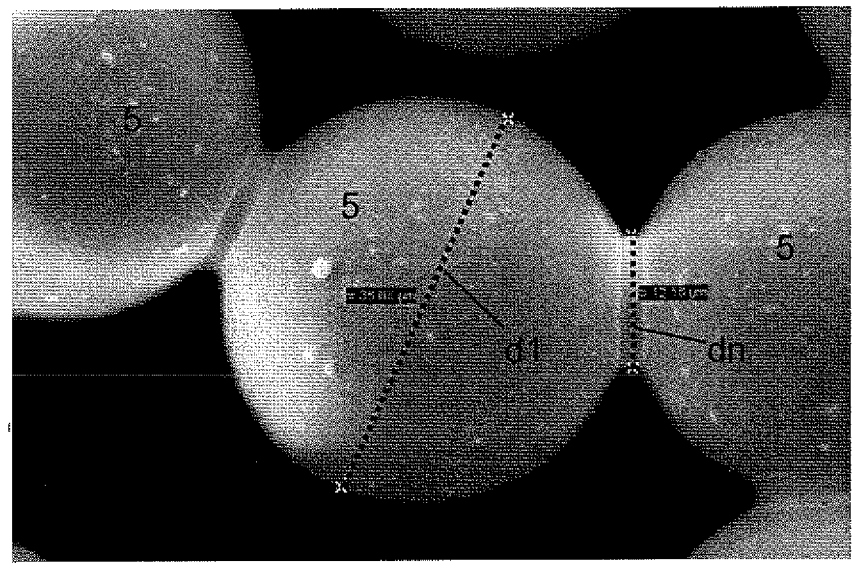
FIG. 22 shows a microscopic image of a detail in a structure comprising attached microparticles and silver nanoparticles according to an embodiment of a bridging arrangement.

FIG. 22 shows a microscopic image of a structure comprising attached $SiO_2$ microparticles and silver nanoparticles. The structure is prepared by first dispersing silicon dioxide particles with the diameter of roughly $d1=38$ μm in water and placing a drop of the suspension on a silicon substrate. The carrier fluid water was evaporated subsequently. Next, a drop of silver nanoparticles having an average diameter of $d2=10$ nm suspended in a xylene mixture is dispensed onto the particle bed of the first microparticles. In the nanoparticle suspension the silver nanoparticles correspond to about 30 wt % of the suspension and 5 vol % of the suspension. The xylene mixture is then dried on top of the silicon dioxide particles 5. As explained according to FIGS. 10 through 15 necks 13 form due to the capillary forces in the vicinity of the contacts between the silicon oxide particles 5. FIG. 22 shows a neck diameter of roughly $dn=12$ μm formed by the silver nanoparticles.

The boiling point of xylene is at about 140° C. The drying or evaporation of the carrier fluid for the nanoparticles suspension can be performed at a temperature ranging between 40 and 80° C. Optional process steps like annealing or plating may lock the nanoparticles in place for stabilizing the necks 13. As an example, an additional annealing step a temperature between 150 and 200° C. for up to 2 hours is performed. Alternatively, also conformal deposition, for example atomic layer deposition of oxides or a parylene deposition from the gas phase can be performed for stabilizing the necks and microparticles mechanically. Furthermore, a polymer or sol gel material can be diluted in the carrier fluid to enhance the adhesion between the colloids, after evaporation and an optional curing step.

Figure 23:
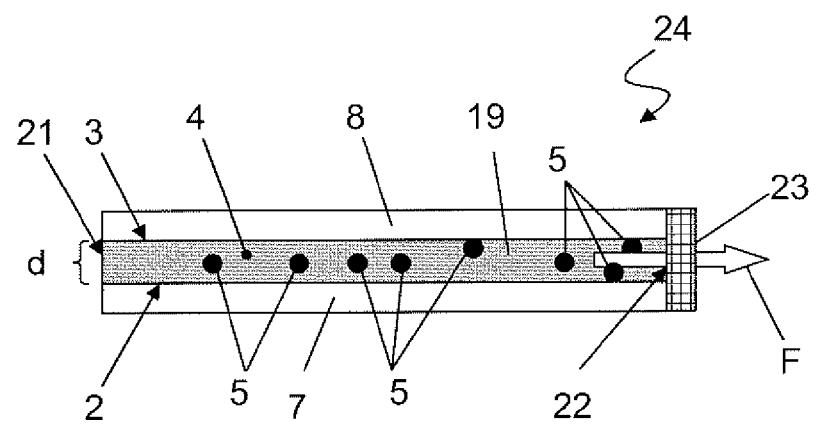
FIGS. 23-25 show schematic diagrams of an embodiment of a stacked surface for illustrating method steps for providing a path of attached microparticles.
Figure 24:
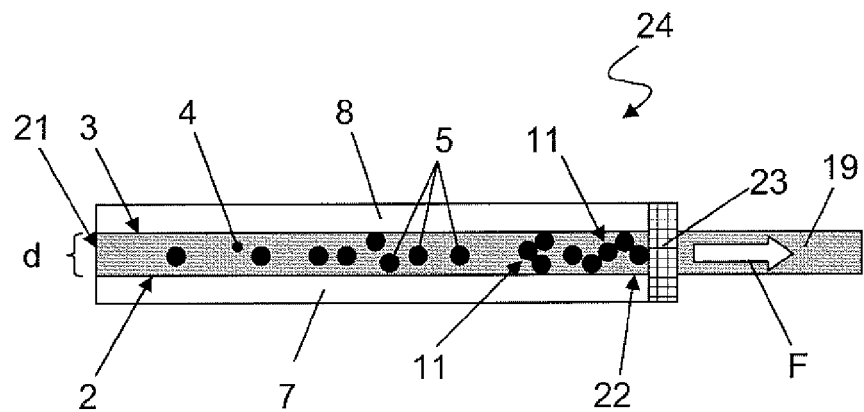
Figure 25:
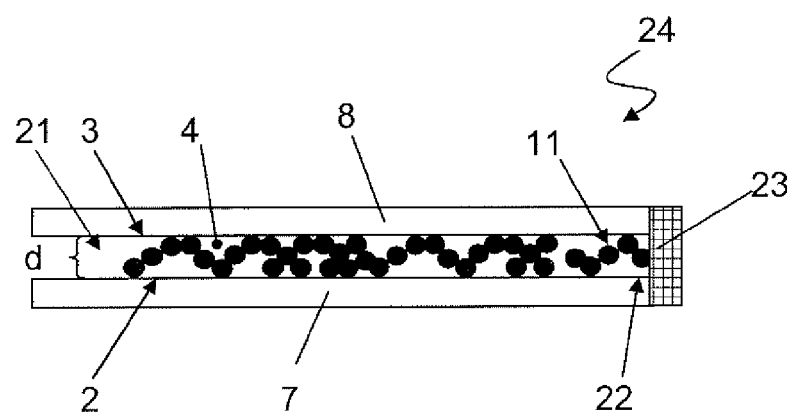

FIGS. 23-25 show schematic diagrams of an embodiment of a stacked-surface arrangement and illustrates preparatory method steps involved in providing of a percolation network of microparticles in the region between two surfaces. FIGS. 23-25 show cross-sectional views of a two-surface arrangement. A gap region 4 is defined by two flat structural elements 7, 8 which are placed in parallel at a distance d. For example, the first structural element 7 can be a substrate or a circuit board, and the second structural element 8 can be an integrated circuit chip. However, FIG. 5 can also be seen as a detail of a multi-chip stack, wherein the lower and the upper structural element 7, 8 are integrated circuits.

FIG. 23 shows a first surface 2 and a second surface 3 of the substrate 7 and of the integrated circuit 8, respectively. In the orientation of FIG. 5 on the left-hand side, an inlet 21 for a fluid is shown, and on the right-hand side, an outlet 22 is shown. The outlet 22 is closed by a barrier element 23. The gap region 4 can be regarded as a cavity which is confined by the two surfaces 2, 3, the barrier element 23 at the outlet 22, the inlet 21 and two lateral barriers that are in-plane and therefore not shown in the figure.

For generating percolation paths connecting the two surfaces 2 and 3, a suspension is applied to the gap region 4. The suspension comprises a carrier fluid, which can be, for example, water or another liquid having sufficiently low viscosity for flowing in the gap 4. The carrier fluid is, hence, chosen as to allow for a flow or stream from the inlet 21 to the outlet 22. The suspension includes the micro particles, of, for example, spherical shape. The filler particles have a relatively high thermal and/or electrical conductivity.

FIG. 23 shows the suspension being applied to the gap region 4. A flow F is generated from an inlet 21 to the outlet 22. The microparticles 5 are essentially dispersed in the carrier fluid 19. The barrier element 23 is implemented as to withhold the microparticles 5 at the outlet 22. For example, the barrier element 23 is implemented as a filter in terms of a porous medium, a micro strainer or sieve preventing the microparticles 5 from exiting through the outlet 22.

As a result, as shown in FIG. 24, microparticles 5 accumulate first in the outlet region 22 while the carrier fluid 1 essentially passes the barrier element 23 and exits the gap region 4. By withholding the micro particles 5 they accumulate downstream towards the outlet 22. There are chains or percolation paths 11 of attached micro particles 5 formed between the first surface 2 and the second surface 3. In FIG. 24, as an example, two such percolation paths 11 are indicated by the white dotted lines between the surface 2 of the substrate 7 and the surface 3 of the integrated circuit chip 8.

Further, generating a flow F of the suspension containing carrier fluid 19 or carrier liquid 19 with the microparticles 5 leads to the generation of a plurality of percolation paths 11 of attached micro particles 9. FIG. 25 shows accumulated microparticles 5 that have formed a plurality of percolation paths indicated by the white dotted lines connecting the first surface 2 with the second surface 3. The withheld microparticles 5 may form a network of particles attached to each other. The carrier fluid 19 can be removed of the void spaces between the percolation paths 11. For example, the residual carrier fluid after the generation of percolation paths 11 is removed by evaporation. One may also apply a reduced surrounding pressure in order to facilitate the removal of any residual carrier fluid from the gap region 4.

One may also add the nanoparticles to the carrier fluid 19 and take advantage of the surface formation of the liquid around the stacked microparticles when it is evaporated. However, one may also continue with method steps according to FIGS. 9-15 after forming the percolation paths of microparticles.

FIG. 25 shows the resulting network of percolated filler balls or particles 9. Percolation paths 11 stretching from one surface 2 to the other 3 are indicated by white dotted lines. Since the attached filler 9 particles connect thermally the first surface 2 with the second surface 3 without an interruption of the resulting path by voids it is sufficient to have a relatively low filling factor of the filler particles 9 in the gap region 4.

The method steps illustrated in FIGS. 23-25 resulting in percolation of the microscopic particles 5 as a filler. The particles 5 are stacked in the gap region 4 by convective filling from the low particle fill suspension 5, 19, using a low viscosity fluid 19 as a carrier (e.g. water). Conventionally, an epoxy matrix is dispensed in a further step, by capillary force, to mechanically strengthen the particle bed. Thermal conductivity values between 1.0 and 1.5 W/m/K were achieved. The main thermal bottleneck in heat dissipation trough such percolating particle beds is the particle-to-particle contact, which may consist of a single point contact. By forming neck-like couplings between the microparticles as shown above a higher thermal conductivity can be obtained.

Figure 26:
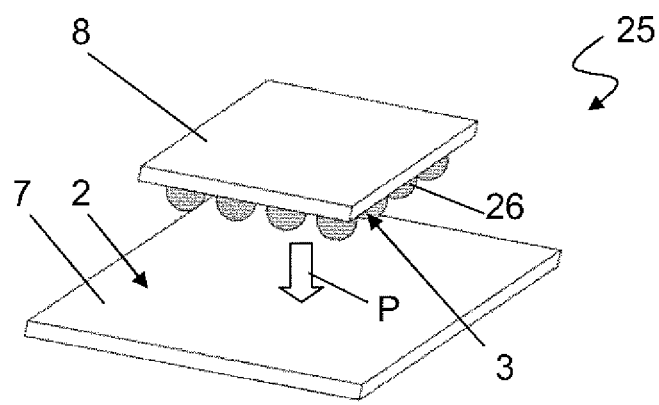
FIGS. 26 and 27 show schematic diagrams of an embodiment of a flip-chip device with a stacked-surface arrangement and illustrates method steps involved in the manufacturing of a thermally conducting underfill including a bridging arrangement.
Figure 27:
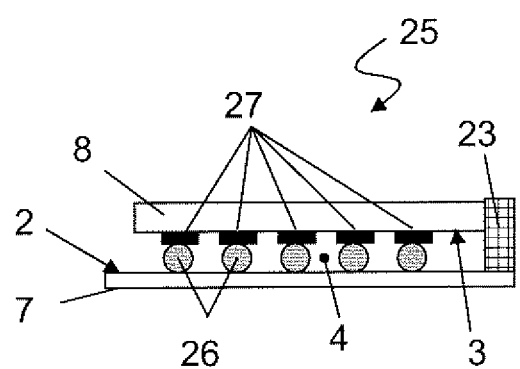

FIGS. 26 and 27 show schematic diagrams of an embodiment of a flip-chip device with a stacked surface arrangement and illustrates method steps involved in the manufacturing of a thermally conducting underfill including a bridging arrangement. Flip-chips or controlled collapse chip connections (C4) avoid wire bonding techniques, and are widely employed in highly integrated electronics devices. Then, the active side of a silicon chip containing integrated circuits is faced downwards and mounted onto a substrate. The electronic connection is usually realized by solder balls coupled to a chip pad. Solder balls are deposited on such pads on the top side of the wafer during the chip manufacture. After that, the chip is flipped over onto a substrate, and the solder is flowed to realize the electric interconnect to the substrate.

FIG. 26 shows a perspective view of a flip-chip which is placed onto a substrate. The flip-chip arrangement 25 schematically comprises the substrate 7 having a surface 2, the integrated circuit chip 8 having the solder balls 26 attached. The solder balls 26 are typically arranged in terms of an array. As illustrated in FIG. 26, the chip 8 is placed onto the substrate 7 as indicated by the arrow P.

FIG. 27 shows the flip-chip arrangement 25 in a cross-sectional view. After soldering the solder balls 26, the bottom surface 3 of the integrated circuit 8 faces towards the upper surface 2 of the substrate 7. The solder balls 26 are attached to the integrated circuit 8 by pads 27. The arrangement is similar to what is shown in FIG. 23. A barrier element 23 is provided to prevent microparticles in a suspension fed into the void or gap between the first and the second surface 2, 3 from exiting the gap. An underfill in terms of a bridging arrangement in the gap 4 is produced along the lines of FIG. 9-15 or 16-19.

Figure 28:
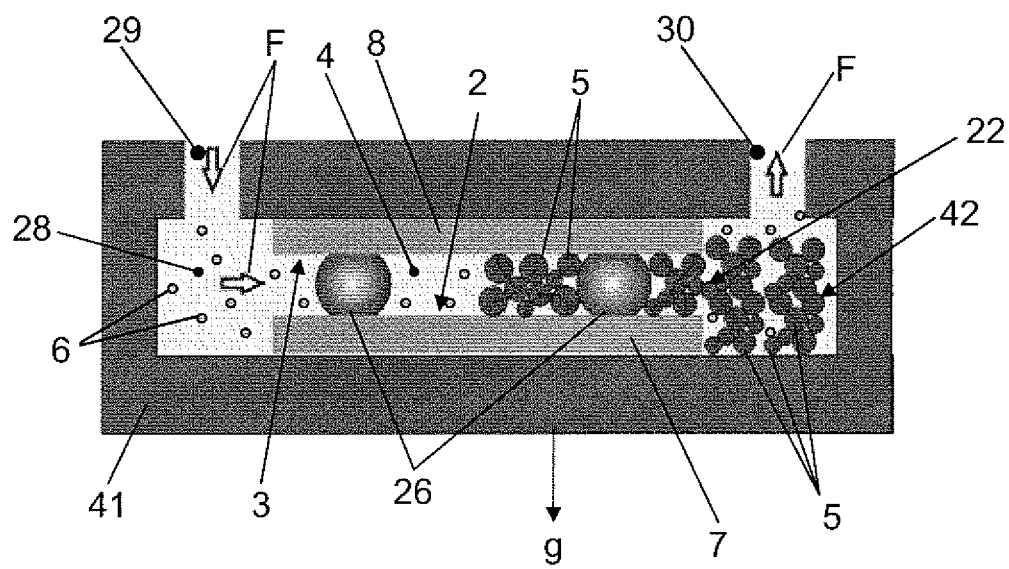
FIG. 28 shows a sectional view of an embodiment of a stacked-surface arrangement for illustrating an embodiment of the method for manufacturing thermally conducting underfill including a bridging arrangement.

FIG. 28 shows a sectional view of an embodiment of stacked-surface arrangements for illustrating another embodiment of the method for manufacturing a thermally conducting underfill including a bridging arrangement. A suspension contemporaneously containing microparticles 5 and nanoparticles 6 is used. For applying the suspension of carrier fluid 28 and dispersed particles 5, 6 the stacked-surface structure is placed in an enclosure 41 or the stacked-surface is encapsulated. The enclosure 41 has an inlet 29 for the suspension and an outlet 30 of the suspension. The enclosure 41 is adapted to guide the flow F of the suspension 28 through the gap region 4 between the first and the second surface 2, 3, and inlet 29 and outlet 30 of the enclosure 41 are arranged at the top side.

FIG. 28 shows gravity g pointing downwards. Hence, when the flow F of the suspension is sufficiently slow microparticles 9 may sediment onto the bottom surface 2. FIG. 28 shows an enhanced sedimentation of microparticles 5 in the vicinity of the outlet 30 of the gap region 4. The sedimented particles 5 form a barrier for the remaining microparticles 5 in the gap region 4 flowing from the inlet 29, through the elongated gap region 4, the outlet 22 of the gap to the outlet 30 of the enclosure 41. Then, the microparticles 5 are kept in the gap region as the sediment acts as a filter or barrier at the outlet 22. Consequently, percolation paths indicated by white dotted lines are generated in the gap 4.

As depicted in FIG. 28 the microparticles 5 may act as barrier elements themselves. By arranging the stacked-surface arrangement in an enclosure and taking advantage of gravitational forces a percolation network of microparticles can be stimulated in terms of sedimentation of particles. Since the fluid 28 also carries the nanoparticles necks around the contact points of the microparticles may self-assemble when the carrier fluid is evaporated.

FIG. 29 shows schematic diagrams of a multi stack of flip-chip integrated circuits with a thermal underfill that comprises bridging arrangements and illustrates method steps involved in the manufacturing of a thermal underfill in the gap regions between the ICs. In packages with controlled collapse chip connections (C4) the underfill of gaps between adjacent chips is considered the main thermal bottle neck in a chip stack. Most of the thermal power is dissipated through the solder balls connecting the various chips. The thermal conductive underfill or filler results in a reduced thermal resistance and thermal gradients in the package.

Figure 29A:
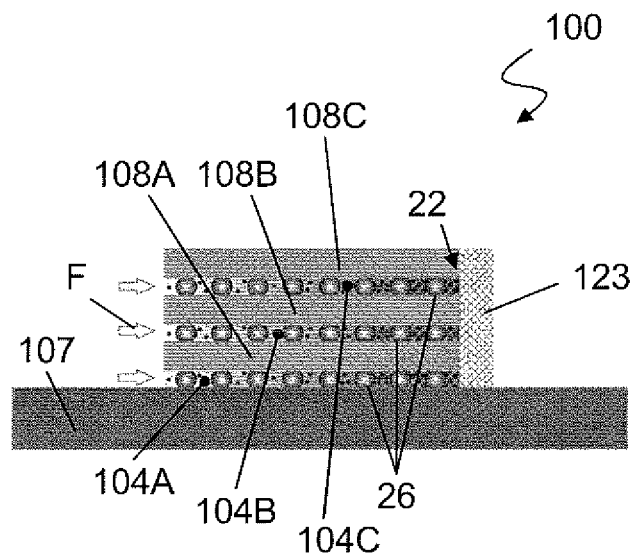
FIGS. 29A and 29B show schematic diagrams of an embodiment of chip stack arrangement and illustrate steps involved in the manufacturing of a thermally conducting filling including a bridging arrangement in a gap region between surfaces.
Figure 29B:
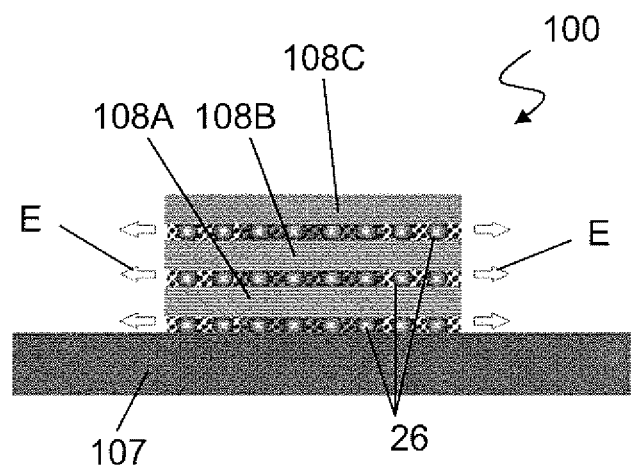

FIG. 29A shows a chip stack comprising three chips 108A, 108B, 108C placed on top of each other on a substrate 107. The electrical connection to the substrate 107 and the electrical interconnect between the chips are realized by solder balls 26. Optionally, on the top chip 108C a cooling device can be attached by use of a thermal paste.

In the illustration of FIG. 29A, three gap regions 104A, 104B, 104C can be seen between the chips 108a, 108b, 108c and the substrate 107. There is provided a filter element 123 that encloses the gap regions 104A, 104B and 104C. The filter element 123 can comprise, for instance, a fibrous web or fleece appropriate for withholding microparticles that are dispersed in a suspension. The arrows F in FIG. 29A indicate a flow of the suspension including microparticles, nanoparticles and a carrier fluid. The carrier fluid passes the filter element 123 while in the gap region first the microparticles accumulate and form percolation paths connecting the various surfaces of the chip stack that are opposite to each other.

Next, the filter element 105 can optional be removed as it is shown in FIG. 22B. Then, for example, by increasing the temperature, residual carrier fluid is evaporated which is illustrated by the arrows E in FIG. 29B. By removing the carrier fluid, the nanoparticles form necks around the point contacts between the microparticles and improve the heat transport by the microparticles as shown, for example with respect to FIGS. 19-21.

The following tables 1 and 2 illustrate materials for nanoparticles and/or microparticles. According to the desired mechanical, electrical or thermal properties of the bridging arrangement the materials for the micro- or nanoparticles can be chosen appropriately. For example, metallic nano- and microparticles can provide for a rigid structure if an annealing process is performed. However, metallic materials may also serve for a good electrical connection between two surfaces. The tables disclose feasible combinations of nano- and microparticle materials. M stands for a mechanical functionality such as rigidity or elasticity of the bridging device. T stands for thermal properties, in particular for a heat transfer between surfaces. E refers to electrical transport properties like a low electrical resistance of the percolation paths in an underfill. G refers to magnetic properties of an underfill or the bridging device. For example, a network of microparticle comprising or being made of germanium combined with nanoparticles comprising or made of copper are in particular suitable for tailoring mechanical (M) and/or thermal (T) properties of the resulting bridging arrangement.

TABLE 1

| M: mechanical T: thermal E: electrical G: magnetic | | microparticle material | | | | | | | | | |
|---|---|---|---|---|---|---|---|---|---|---|---|
| | | Polystyrene | SiO$_2$ | Al$_2$O$_3$ | MgO | ZnO | Si | Ge | GaAs | BN | AlN |
| nanoparticle material | Polystyrene | M | M | M | M | M | M | M | M | M | M |
| | SiO$_2$ | M | M, T | M, T | M, T | M, T | M, T | M, T | M, T | M, T | M, T |
| | Al$_2$O$_3$ | M | M, T | M, T | M, T | M, T | M, T | M, T | M, T | M, T | M, T |
| | MgO | M | M, T | M, T | M, T | M, T | M, T | M, T | M, T | M, T | M, T |
| | ZnO | M | M, T | M, T | M, T | M, T | M, T | M, T | M, T | M, T | M, T |
| | Si | M | M, T | M, T | M, T | M, T | M, T | M, T | M, T | M, T | M, T |
| | Ge | M | M, T | M, T | M, T | M, T | M, T | M, T | M, T | M, T | M, T |
| | GaAs | M | M, T | M, T | M, T | M, T | M, T | M, T | M, T | M, T | M, T |
| | BN | M | M, T | M, T | M, T | M, T | M, T | M, T | M, T | M, T | M, T |
| | AlN | M | M, T | M, T | M, T | M, T | M, T | M, T | M, T | M, T | M, T |
| | SiC | M | M, T | M, T | M, T | M, T | M, T | M, T | M, T | M, T | M, T |
| | InN | M | M, T | M, T | M, T | M, T | M, T | M, T | M, T | M, T | M, T |
| | Cu | M | M, T | M, T | M, T | M, T | M, T | M, T | M, T | M, T | M, T |
| | Al | M | M, T | M, T | M, T | M, T | M, T | M, T | M, T | M, T | M, T |
| | Ag | M | M, T | M, T | M, T | M, T | M, T | M, T | M, T | M, T | M, T |
| | Au | M | M, T | M, T | M, T | M, T | M, T | M, T | M, T | M, T | M, T |
| | C | M | M, T | M, T | M, T | M, T | M, T | M, T | M, T | M, T | M, T |
| | Ni | M | M, T | M, T | M, T | M, T | M, T | M, T | M, T | M, T | M, T |
| | Fe | M | M, T | M, T | M, T | M, T | M, T | M, T | M, T | M, T | M, T |

TABLE 2

| | | microparticle material | | | | | | | | |
|---|---|---|---|---|---|---|---|---|---|---|
| M: mechanical T: thermal E: electrical G: magnetic | | SiC | InN | Cu | Al | Ag | Au | C | Ni | Fe |
| nanoparticle material | Polystyrene | M | M | M | M | M | M | M | M, G | M, G |
| | SiO$_2$ | M, T | M, T | M, T | M, T | M, T | M, T | M, T | M, T, G | M, T, G |
| | Al$_2$O$_3$ | M, T | M, T | M, T | M, T | M, T | M, T | M, T | M, T, G | M, T, G |
| | MgO | M, T | M, T | M, T | M, T | M, T | M, T | M, T | M, T, G | M, T, G |
| | ZnO | M, T | M, T | M, T | M, T | M, T | M, T | M, T | M, T, G | M, T, G |
| | Si | M, T | M, T | M, T | M, T | M, T | M, T | M, T | M, T, G | M, T, G |
| | Ge | M, T | M, T | M, T | M, T | M, T | M, T | M, T | M, T, G | M, T, G |
| | GaAs | M, T | M, T | M, T | M, T | M, T | M, T | M, T | M, T, G | M, T, G |
| | BN | M, T | M, T | M, T | M, T | M, T | M, T | M, T | M, T, G | M, T, G |
| | AlN | M, T | M, T | M, T | M, T | M, T | M, T | M, T | M, T, G | M, T, G |
| | SiC | M, T | M, T | M, T | M, T | M, T | M, T | M, T | M, T, G | M, T, G |
| | InN | M, T | M, T | M, T | M, T | M, T | M, T | M, T | M, T, G | M, T, G |
| | Cu | M, T | M, T | M, T, E | M, T, E | M, T, E | M, T, E | M, T, E | M, T, E, G | M, T, E, G |
| | Al | M, T | M, T | M, T, E | M, T, E | M, T, E | M, T, E | M, T, E | M, T, E, G | M, T, E, G |
| | Ag | M, T | M, T | M, T, E | M, T, E | M, T, E | M, T, E | M, T, E | M, T, E, G | M, T, E, G |
| | Au | M, T | M, T | M, T, E | M, T, E | M, T, E | M, T, E | M, T, E | M, T, E, G | M, T, E, G |
| | C | M, T | M, T | M, T, E | M, T, E | M, T, E | M, T, E | M, T, E | M, T, E, G | M, T, E, G |
| | Ni | M, T | M, T | M, T, E | M, T, E | M, T, E | M, T, E | M, T, E | M, T, E, G | M, T, E, G |
| | Fe | M, T | M, T | M, T, E | M, T, E | M, T, E | M, T, E | M, T, E | M, T, E, G | M, T, E, G |

The bridging structures or arrangements of this disclosure can be considered as particle filled material systems, for example underfills between surfaces for thermal dissipation, mechanical or electrical properties. The microparticle filling factor can be reduced by arranging percolation paths. Potential bottle necks for electric transfer, mechanical characteristics or thermal transfer between microparticles forming the percolation paths can be reduced by nanoparticle necks.

The proposed structures with nanoparticles accumulated in the contact region between microparticles allows for enhanced thermal, electrical or mechanical properties without deforming the involved particles or percolation paths. Hence, the proposed methods and bridging devices are in particular suitable for brittle particles such as oxides where a plastic deformation is not desired or possible.

The plurality of bridging structures may result in a filling in a gap region between surfaces. Usually, a high concentration of a filler particle is necessary which also increases the viscosity of an underfill material during the production process. However, a filling of gaps with microparticles can be performed with a low viscosity medium such as a carrier fluid with suspended particles. The microparticles then easily stack to percolation paths with their thermal or electric conductance being improved by agglomerated nanoparticles in the contact regions. The proposed bridging devices are easily manufactured as colloidal suspensions containing micro- and nanoparticles for example resin water can be applied to a gap region contemporaneously. The use of such suspensions provide for an automatic arrangement of the nanoparticles in terms of necks at contact points between the microparticles. A self-assembling system comprising the micro- and nanoparticles forming relatively rigid and mechanically stable percolation paths with a good thermal or electric conductivity is also contemplated.

LIST OF REFERENCE CHARACTERS 1, 100 bridging arrangement
2 first surface
3 second surface
4 gap region
5 microparticle
6 nanoparticle
7 substrate
8 integrated circuit chip
9 contact
10 contact region
11 percolation path
12 percolation path
13 nanoparticle neck
14 carrier fluid
15 fluid surface
16 contact region
17 resin
18 dielectric coating
19 carrier fluid
20 magnetic field
21 inlet
22 outlet
23 filter element
24 stacked surface arrangement
25 flip chip package
26 solder ball
27 pad
28 bimodal suspension
29 suspension inlet
30 suspension outlet
31 particle surface
100 multi-chip stack
104A gap region
104B gap region
104C gap region
105 filter element
107 substrate
108A chip
108B chip
108C chip
C1-C5 thermal conductance curve
d1 microparticle diameter
d2 nanoparticle diameter
d spacing distance
E evaporation
F flow direction
g gravity P chip placement
R1, R2 thermal resistance
S1-S4 method step

The invention claimed is:

1. A method for manufacturing a bridging arrangement between a first terminal and a second terminal, the method comprising:
    providing at least one path of particles of a first type between the first terminal and the second terminal, the particles of the first type comprising microparticles having a diameter on a micrometer scale;
    applying a suspension comprising a carrier fluid and a plurality of particles of a second type in a region between the first and the second terminal; and
    removing the carrier fluid such that a plurality of particles of the second type arrange in a vicinity of a contact region between a first particle of the first type and a second particle of the first type, wherein at least a portion of the plurality of particles of the second type is attached to the first particle of the first type and the second particle of the first type;
    wherein the particles of the second type comprise nanoparticles having a diameter on a nanometer scale such that the diameter of the particles of the first type is about 100 times or more greater than the diameter of the particles of the second type, and wherein at least a portion of the plurality of particles of the second type is attached to the first particle of the first type and the second particle of the first type, so as to form a ring-shaped neck, the ring-shaped neck configured to mechanically stabilize at least one percolation path between a surface of the first particle of the first type and a surface of the second particle of the first type.

2. The method of claim 1, further comprising:
    filling void space between the particles of the first type and the particles of the second type in the region between the first terminal and the second terminal with a resin.

3. The method of claim 1, further comprising removing residual further carrier fluid from the region between the first terminal and the second terminal after withholding particles of the first type.

4. The method of claim 1, wherein providing at least one path comprises:
    applying a further suspension comprising a further carrier fluid and particles of the first type in the region between the first and the second terminal; and
    withholding particles of the first type by means of a barrier element in the region between the first terminal and the second terminal for forming the path of attached particles between the first terminal and the second terminal.

5. The method of claim 4, wherein the suspension and the further suspension are applied contemporaneously.

6. The method of claim 1, wherein at least one contact region between a first particle of the first type and a second particle of the first type is surrounded by a plurality of particles of the second type.

7. The method of claim 1, wherein the particles of the first type and/or the particles of the second type have a spherical shape.

8. The method of claim 1, further comprising a filler material surrounding the particles of the first type and of the second type.

9. The method of claim 1, wherein the particles of the first type and/or the particles of the second type are ferromagnetic particles.

10. The method of claim 1, wherein the particles of the first type and/or the particles of the second type have a dielectric coating.

11. The method of claim 1, wherein the particles of the first type and/or the particles of the second type are adapted to form a heat bridge between the first terminal and the second terminal.

12. A method of forming a stacked-surface arrangement, the method comprising:
    forming a bridging arrangement between a first terminal and a second terminal, the bridging arrangement being arranged in a gap region between a first surface in parallel with a second surface, wherein at least one of the first and second surfaces is a surface of an integrated circuit chip, the at least one surface comprising pads for electrically connecting the integrated circuit chip with solder balls, the bridging arrangement configured to thermally couple the first surface and the second surface wherein the first surface corresponds to the first terminal and the second surface corresponds to the second terminal;
    wherein the forming the bridging arrangement further comprises:
        providing at least one path of particles of a first type between the first terminal and the second terminal, the particles of the first type comprising microparticles having a diameter on a micrometer scale;
        applying a suspension comprising a carrier fluid and a plurality of particles of a second type in a region between the first and the second terminal; and
        removing the carrier fluid such that a plurality of particles of the second type arrange in a vicinity of a contact region between a first particle of the first type and a second particle of the first type, wherein at least a portion of the plurality of particles of the second type is attached to the first particle of the first type and the second particle of the first type;
        wherein the particles of the second type comprise nanoparticles having a diameter on a nanometer scale such that the diameter of the particles of the first type is about 100 times or more greater than the diameter of the particles of the second type, and wherein at least a portion of the plurality of particles of the second type is attached to the first particle of the first type and the second particle of the first type, so as to form a ring-shaped neck, the ring-shaped neck configured to mechanically stabilize at least one percolation path between a surface of the first particle of the first type and a surface of the second particle of the first type.

13. The method of claim 12, wherein at least one contact region between a first particle of the first type and a second particle of the first type is surrounded by a plurality of particles of the second type.

* * * * *